US012342617B2

(12) United States Patent
Barraud et al.

(10) Patent No.: US 12,342,617 B2
(45) Date of Patent: Jun. 24, 2025

(54) MICROELECTRONIC DEVICE WITH TWO FIELD-EFFECT TRANSISTORS

(71) Applicant: COMMISSARIAT A L'ENERGIE ATOMIQUE ET AUX ENERGIES ALTERNATIVES, Paris (FR)

(72) Inventors: Sylvain Barraud, Grenoble (FR); Joris Lacord, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 188 days.

(21) Appl. No.: 18/339,319

(22) Filed: Jun. 22, 2023

(65) Prior Publication Data

US 2024/0030221 A1    Jan. 25, 2024

(30) Foreign Application Priority Data

Jun. 22, 2022  (FR) ...................... 22 06178

(51) Int. Cl.
*H10D 30/63*   (2025.01)
*H03K 17/687*  (2006.01)
*H10D 86/00*   (2025.01)

(52) U.S. Cl.
CPC ......... *H10D 86/201* (2025.01); *H03K 17/687* (2013.01); *H10D 30/637* (2025.01)

(58) Field of Classification Search
CPC .................................................. H10D 30/637
USPC ....................................................... 327/109
See application file for complete search history.

(56) References Cited

U.S. PATENT DOCUMENTS

| 2012/0018807 A1 | 1/2012 | Tsuchiya et al. |
| 2014/0167167 A1* | 6/2014 | Hasbani ................. H10D 86/01 257/350 |
| 2022/0269933 A1 | 8/2022 | Das et al. |

FOREIGN PATENT DOCUMENTS

| KR | 10-2011-0105826 A | 9/2011 |
| WO | WO 2007/109658 A2 | 9/2007 |
| WO | WO 2021/050194 A1 | 3/2021 |

OTHER PUBLICATIONS

French Preliminary Search Report issued Feb. 20, 2023 in French Application 22 06178 filed on Jun. 22, 2022, 9 pages (with English Translation of Categories of Cited Documents and Written Opinion).
C. Fenouillet- Beranger et al., "Hybrid FDSOI/Bulk high-k/Metal gate platform for Low Power (LP) multimedia technology", IEEE International Electron Device Meeting (IEDM) Technical Digest, 2009, p. 667-670.

* cited by examiner

*Primary Examiner* — Tomi Skibinski
(74) *Attorney, Agent, or Firm* — Oblon, McClelland, Maier & Neustadt, L.L.P.

(57) ABSTRACT

A microelectronic device includes a field-effect n-MOS transistor, a first N-doped zone, constituting one from among the drain and the source of the n-MOS transistor and a second N-doped zone, constituting the other from among the drain and the source of the n-MOS transistor. The device further includes a field-effect p-MOS transistor, a first P-doped zone, constituting one from among the drain and the source of the p-MOS transistor, a dielectric layer in contact with the doped zones and a rear gate. The n-MOS transistor and the p-MOS transistor are separated by a PN junction.

19 Claims, 13 Drawing Sheets

| Parameters | Values |
|---|---|
| $V_{G1} = V_{G2}$ | [-1V, 0V] |
| $V_{DS}$ | 1V |
| $V_{BG}$ | [-1V, 2V] |

| Parameters | Values |
|---|---|
| $V_{G1} = V_{G2}$ | -1V |
| $V_{DS}$ | 1V |
| $V_{BG}$ | {1,7V ; 1,8V} |

| Parameters | Values |
|---|---|
| $V_{G1} = V_{G2}$ | -1V |
| $V_{DS}$ | 1V |
| $V_{BG}$ | {1,7V ; 1,8V} |

| Parameters | Values |
|---|---|
| $V_{G1} = V_{G2}$ | -1V |
| $V_{DS}$ | 1V |
| $V_{BG}$ | {1,7V ; 1,8V} |

| Parameters | Values |
|---|---|
| $V_{G1} = V_{G2}$ | -1V |
| $V_{DS}$ | 1V |
| $V_{BG}$ | {1,7V ; 1,8V} |

| Parameters | Values |
|---|---|
| $V_{G1}$ | -0,5V |
| $V_{G2}$ | [-1V,1V] |
| $V_{BG}$ | 0,4V |

| Parameters | Values |
|---|---|
| $V_{G1}$ | [-1V,1V] |
| $V_{G2}$ | -0,5V |
| $V_{BG}$ | 0,4V |

MICROELECTRONIC DEVICE WITH TWO FIELD-EFFECT TRANSISTORS

TECHNICAL FIELD

The present invention relates to the microelectronics field and more specifically, advanced CMOS (Complementary Metal Oxide Semiconductor) technologies. It has particularly advantageous applications in low-consumption electronics and in devices for protecting against electrostatic discharges.

STATE OF THE ART

Different types of transistors are currently used in electronic circuits to perform numerous functions (logic circuits, amplification, signal modulation, etc.).

One of the structures currently most used is the FDSOI (Fully Depleted Silicon On Insulator) transistor, represented in FIG. 1. This technology consists of placing a thin insulating layer under the semiconductor layer, for example made of silicon, so as to create a barrier making it possible, in particular, to avoid current leakages. FDSOI transistors are favoured in low-consumption applications.

$Z^2$FET transistors are, themselves, in particular used for memory and protective applications against electrostatic discharges (ESD). This a direct biased p-i-n diode, the intrinsic channel of which is only partially covered by a front gate.

An aim of the present invention is to propose an alternative to current devices, while having a performance which is at least equivalent and/or making it possible to perform functions for which all current devices cannot be used.

SUMMARY

To achieve this aim, a first aspect relates to a microelectronic device comprising:
- a field-effect n-MOS transistor comprising a first drain, a first source, a first gate and a first gate oxide,
- a first N-doped zone, constituting one from among the first drain and the first source,
- a second N-doped zone, constituting the other from among the first drain and the first source.

The device comprises, in addition:
- a field-effect p-MOS transistor comprising a second drain, a second source, a second gate and a second gate oxide,
- a first P-doped zone, constituting the second source if the first N-doped zone constitutes the first drain, or the second drain, if the first N-doped zone constitutes the first source,
- a second P-doped zone, constituting the other from among the second drain and the second source,
- a dielectric layer having an upper face in contact with the first N-doped zone, with the second N-doped zone, with the first P-doped zone and with the second P-doped zone,
- a rear gate in contact with a lower face of the dielectric layer.

It further has the particularity that the second N-doped zone and the second P-doped zone form a PN junction.

The aim thus defined constitutes a microelectronic device which could replace, in numerous applications, the transistors currently used. This device can further have improved performance. Advantageously, it makes it possible to generate a sudden switching thanks to the PN junction, which can be used, for example, for high slope devices. The current levels used can remain low, even though this technique suits very low energy consumption electronic systems.

A second aim relates to a method for controlling the device, wherein the first control voltage $V_{110}$ is applied to the first N-doped zone and the second control voltage $V_{210}$ is applied to the first P-doped zone, and wherein:
- The first control voltage $V_{110}$ constitutes a source voltage $V_S$ of the device and the second control voltage $V_{210}$ constitutes a drain voltage $V_D$ of the device, or
- The second control voltage $V_{210}$ constitutes the source voltage $V_S$ of the device and the first control voltage $V_{110}$ constitutes the drain voltage $V_D$ of the device.

BRIEF DESCRIPTION OF THE FIGURES

The aims, objectives, as well as the features and advantages of the invention will emerge best from the detailed description of an embodiment of the latter which is illustrated by the following accompanying drawings, wherein.

Figure 1:
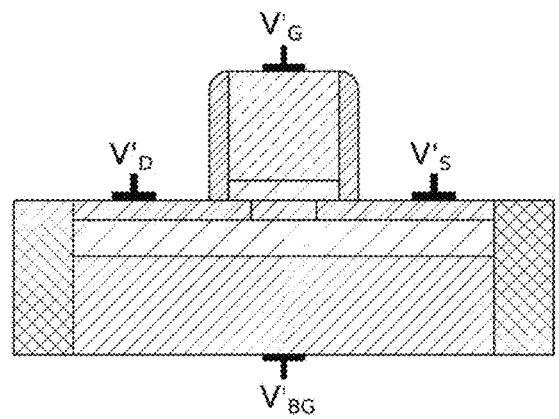
FIG. 1 represents an FDSOI transistor such as known from the prior art.

The drawings are given as examples and are not limiting of the invention. They constitute principle schematic representations intended to facilitate the understanding of the invention and are not necessarily to the scale of practical applications. In particular, the dimensions are not representative of reality.

DETAILED DESCRIPTION

Before starting a detailed review of embodiments of the invention, optional features are stated below which can optionally be used in association or alternatively:

According to an example, the device further comprises a first electrode and a second electrode, the first N-doped zone is in contact with the first electrode which is configured to receive a first control voltage $V_{110}$ and the first P-doped zone is in contact with the second electrode which is configured to receive a second control voltage $V_{210}$.

According to an example:

The first control voltage $V_{1100}$ constitutes a source voltage $V_S$ of the device and the second control voltage $V_{210}$ constitutes a drain voltage $V_D$ of the device, or The second control voltage $V_{210}$ constitutes the source voltage $V_S$ of the device and the first control voltage $V_{110}$ constitutes the drain voltage $V_D$ of the device.

According to an example, the device further comprises a first gate electrode and a second gate electrode, the first gate is in contact with the first gate electrode which is configured to receive the application of a first gate voltage $V_{G1}$ and the second gate is in contact with the second gate electrode which is configured to receive the application of a second gate voltage $V_{G2}$.

According to an example, the device comprises a rear gate electrode and the rear gate is in contact with the rear gate electrode which is configured to receive the application of a rear gate voltage $V_{BG}$.

According to an embodiment, the device further comprises a control circuit configured to apply:

the first control voltage $V_{110}$ on the first electrode,
the second control voltage $V_{210}$ on the second electrode,
the first gate voltage $V_{G1}$ on the first electrode,
the second gate voltage $V_{G2}$ on the second electrode,
the rear gate voltage $V_{BG}$ on the rear gate electrode,
the first control voltage $V_{110}$, the second control voltage $V_{210}$, the first gate voltage $V_{G1}$, the second gate voltage $V_{G2}$ and the rear gate voltage $V_{BG}$ could take different values and at least values of between −5 and 5V.

According to an example, the control circuit is configured to be able to make the device pass from an on configuration, wherein the PN junction is in an on state, to a blocked configuration, wherein the PN junction is in a blocked state, or conversely, this by making the rear gate voltage $V_{BG}$ vary between an open rear gate voltage $V_{BG,ON}$ and a blocked rear gate voltage $V_{BG,OFF}$ distinct from the open rear gate voltage $V_{BG,ON}$.

According to an example, $V_{G1}=V_{G2}+\Delta V_G$ with $\Delta V_G$ of between −1V and +1V.

According to an example, $V_{G1}<0$.
According to an example, $V_{G2}<0$.
According to an example, $V_{G1}>0$ and $V_{G2}>0$.
According to an example, $V_{G1}=V_{G2}$.

According to an example, the PN junction has a diffusion voltage $V_{bi}$, and wherein the drain-source voltage, defined by $V_D$-$V_S$, is greater than the diffusion voltage $V_{bi}$.

According to an example, the rear gate voltage $V_{BG}$ is between −1 and 2V.

According to an example, the n-MOS transistor and the p-MOS transistor are separated by a distance L greater than 10 nm, preferably greater than 50 nm, and/or less than 500 nm.

A second aim of the invention relates to a method for controlling the device. According to an example, the method provides to make the rear gate voltage $V_{BG}$ vary between an open rear gate voltage $V_{BG,ON}$ and a blocked rear gate voltage $V_{BG,OFF}$ distinct from the open rear gate voltage $V_{BG,ON}$, so as to make the device pass from an on configuration, wherein the PN junction is in an on state, to a blocked configuration, wherein the PN junction is in a blocked state.

According to an example, the method provides the application of the voltages $V_{G1}$ and $V_{G2}$ such that $V_{G1}=V_{G2}+\Delta V_G$ with $\Delta V_G$ of between −1V and +1V.

According to an example, the method provides the application of the voltages $V_{G1}$ and $V_{G2}$ such that $V_{G1}>0$ and $V_{G2}>0$.

According to an example, the method provides the application of the voltage $V_{G1}$ such that $V_{G1}<0$.

According to an example, the method provides the application of the voltage $V_{G2}$ such that $V_{G2}<0$.

According to an example, the method provides the application of the voltages $V_{G1}$ and $V_{G2}$ such that $V_{G1}=V_{G2}$.

According to an example, the method provides the application of the voltages $V_{110}$ and $V_{210}$ such that the drain-source voltage, defined by $V_D$-$V_S$, is greater than a diffusion voltage $V_{bi}$ of the PN junction.

According to an example, the method provides the application of a rear gate voltage $V_{BG}$ of between −1 and 2V.

It is specified that, in the scope of the present invention, the terms "on", "surmounts", "covers", "underlying", "opposite" and their equivalents do not necessarily mean "in contact with". Thus, for example, the deposition, the transfer, the adhesion, the assembly or the application of a first layer on a second layer, does not compulsorily mean the two layers are directly in contact with one another, but means that the first layer covers at least partially the second layer by being, either directly in contact with it, or by being separated from it by at least one other layer or at least one other element.

A layer can moreover be composed of several sublayers of one same material or of different materials.

By a substrate, a layer, a device "with the basis of" a material M, this means a substrate, a layer, a device comprising this material M only or this material M and optionally other materials, for example, alloy elements, impurities or doping elements. Thus, a material with the basis of a III-N material can comprise a III-N material added with dopants. Likewise, a GaN-based layer typically comprises GaN and AlGaN or InGaN alloys.

The term "III-V material" makes reference to a semiconductor composed of one or more elements of column III and of column V of Mendeleev's periodic table. Among the elements of column III, there are boron, gallium, aluminium or also indium. Column V contains, for example, nitrogen, arsenic, antimony and phosphorus.

Figure 2A:
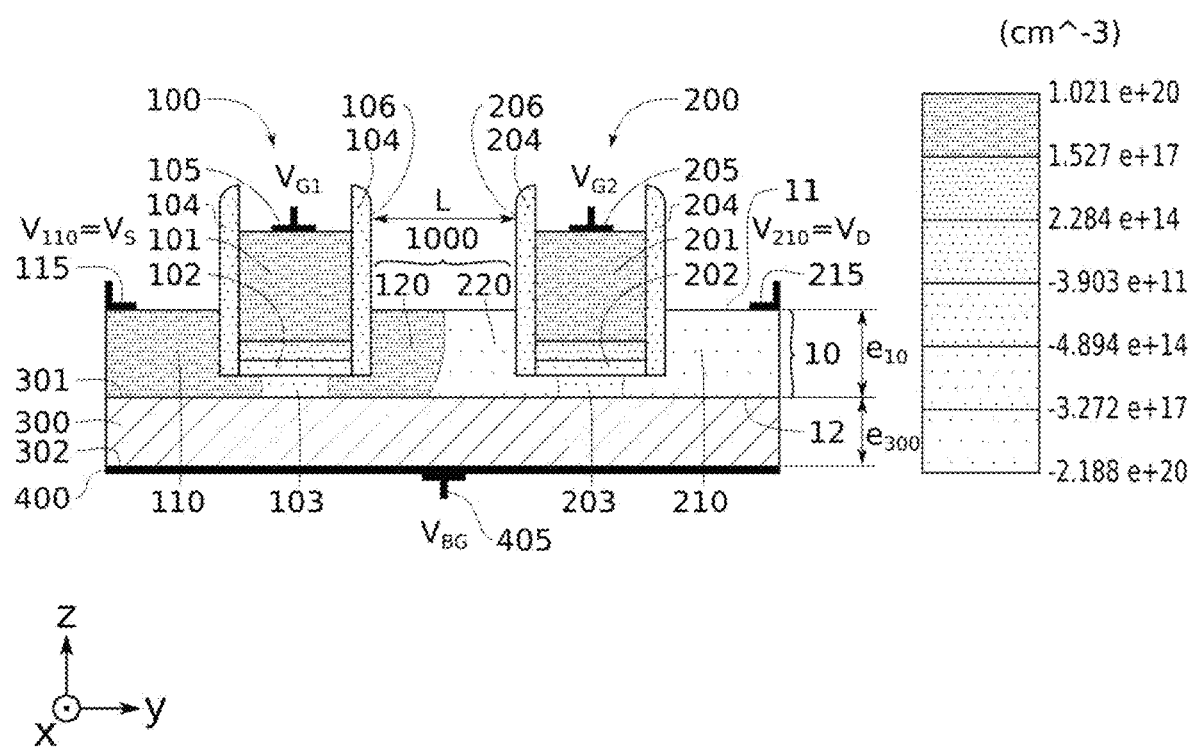
FIGS. 2A and 2B each represent the mapping of the doping within the device according to an embodiment of the invention.

A system, preferably orthonormal, comprising the axes x, y, z is represented in FIG. 2A. This system is applicable by extension to the other figures.

In the present patent application, thickness will preferably be referred to for a layer, and height for a structure or a device. The thickness is taken along a direction normal to the main extension plane of the layer, and the height is taken perpendicularly to the base plane XY. Thus, a layer typically has thickness along z, when it extends mainly along a plane XY, and a projecting element, for example a trench isolation, has a height along z. The relative terms "on", "under", "underlying" refer preferably to positions taken along the direction z.

The terms "substantially", "about", "around" mean "plus or minus 10%, preferably plus or minus 5%".

Figure 2B:
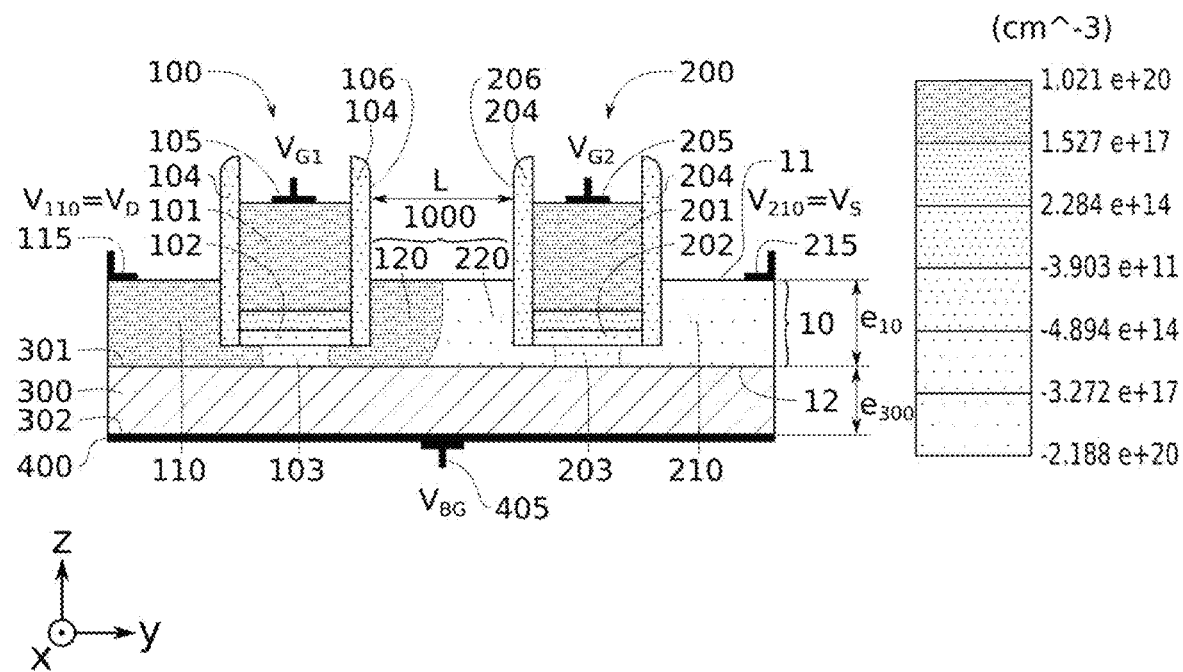

The device according to different embodiments of the invention will now be described in reference to FIGS. 2A and 2B.

The device 1 comprises two field-effect transistors: one of the n-MOS 100 type, and one of the p-MOS 200 type. Preferably, it does not comprise other transistors or at the very least, no other transistors joined to either of the two first ones by a PN junction.

The n-MOS transistor 100 comprises a first drain, a first source, a first gate 101 and a first gate oxide 102.

The first gate oxide 102 extends under the first gate 101. The first N-doped zone 110 and the second N-doped zone 120 are each in contact with a first channel 103, called conduction channel, but which can also be a carrier depleted zone, separating them. This first channel 103 is in contact with the lower face of the first gate oxide 102. The first channel 103 advantageously has a thickness along the direction z of between 5 and 10 nm, typically substantially equal to 7 nm.

The n-MOS transistor 100 comprises, in addition, typically spacers 104 making it possible to insulate the first gate 101 from the first drain, on the one hand and from the first source, on the other hand. These spacers 104 typically cover the side flanks of the first gate 101. They are, inter alia, intended to limit the interfering capacitive coupling between the first gate 101 and the first source on the one hand, and the first drain on the other hand.

The p-MOS transistor 200 comprises a second drain, a second source, a second gate 201, a second gate oxide 202 and a second channel 203, itself also called conduction channel, but which could also be a carrier depleted zone. The features of the n-MOS transistor 100 can be transposed mutatis mutandis to the p-MOS transistor 200.

The n-MOS transistor 100 and the p-MOS transistor 200 are separated by a distance L measured in the plane XY and defined as the distance between a flank 106 of the n-MOS transistor 100 and a flank 206 of the p-MOS transistor 200 facing it. The flanks 106, 206 of the transistors 100, 200 typically correspond to the flanks of the spacers 104, 204. The distance L is preferably, for technological limitation reasons during the manufacturing of the device, greater than 50 nm. It would however be considerable in the targeted applications that the distance L is set to values as low as 10 nm. With the aim of optimising the density of devices which could be integrated on a chip, it is preferably less than 500 nm.

The device comprises, in addition, a first N-doped zone 110 and a second N-doped zone 120. The first N-doped zone 110 and the second N-doped zone 120 can respectively constitute the first drain and the first source, or conversely.

Similarly, the device comprises a first P-doped zone 210 and a second P-doped zone 220 which could respectively constitute the second drain and the second source, or conversely.

The second N-doped zone 120 and the second P-doped zone 220 are in contact and thus form a PN junction 1000. The PN junction 1000 has a diffusion voltage, commonly called "built-in" voltage, referenced $V_{BI}$ and the value of which depends, in particular, on the doping level of the zones 120, 220 constituting it.

The doped zones 110, 120, 210, 220 are preferably all located in an active layer 10. The active layer 10 is preferably with the basis of at least one IV-IV material. It can also be with the basis of at least one III-V material, preferably with the basis of at least one III-N material. For example, this material is GaN-based. This material can also be silicon-based. It can be a homogeneous layer, typically formed of one single material. The active layer 10 typically has an upper face 11 and a lower face 12 both extending mainly in the plane XY of the orthogonal system XYZ. It has, in the direction z, a thickness $e_{10}$. The thickness $e_{10}$ of the active layer 10 is advantageously between 20 and 30 nm, typically substantially equal to 25 nm.

Certain elements constituting the transistors 100, 200 can have been at least partially formed from a continuous layer, called manufacturing layer. For example, certain regions of the manufacturing layer will have been able to be oxidised to form the gate oxides 102, 202 and/or the spacers 104, 204. The manufacturing layer can also have been etched, then different depositions will have been able to be performed on this manufacturing layer, in order to form the gate oxides 102, 202, spacers 104, 204 and/or gates 101, 201. The non-transformed or etched regions of the manufacturing layer thus form part of the active layer 10. The active layer 10 can, in addition, comprise zones having been epitaxially grown from the manufacturing layer.

In order to produce a functional PN junction 1000, in the case where the second N-doped zone 120 constitutes the first drain, the second P-doped zone 220 constitutes the second source. Consequently, the first N-doped zone 110 thus constitutes the first source and the first P-doped zone 220 constitutes the second drain. In this scenario, the first N-doped zone 110 constitutes the source and the first P-doped zone 220, the drain of the device 1.

Conversely, in the case where the second N-doped zone 120 constitutes the first source, the second P-doped zone 220 constitutes the second drain. Consequently, the first N-doped zone 110 thus constitutes the first drain and the first P-doped zone 220 constitutes the second source. In this scenario, the first N-doped zone 110 constitutes the drain and the first P-doped zone 220, the source of the device 1.

The device 1 in addition comprises a dielectric layer 300 having an upper face 301 and a lower face 302 both extending mainly in planes parallel to the plane XY of the orthogonal system. The upper face 301 of the dielectric layer 300 is in contact with the first N-doped zone 110, with the second N-doped zone 120, with the first P-doped zone 210 and with the second P-doped zone 220. The dielectric layer 300 thus constitutes a buried dielectric common to the two transistors 100, 200 and therefore generally, a buried dielectric for the device 1. It has, in the direction z, a thickness $e_{300}$ typically equal to 25 nm. This value corresponds to microelectronics industry standards. The invention can, however, fully operate for other values of $e_{300}$. The value of the rear gate voltage $V_{BG}$ will be adjusted according to the value of $e_{300}$: the thicker the dielectric layer 300 will be, the greater the rear gate voltage to be applied will be.

The device 1 further comprises a rear gate 400 in contact with the lower face 302 of the dielectric layer 300.

The device 1 can comprise the following electrodes or tappings:
  a first electrode 115 in contact with the first N-doped zone 110,
  a second electrode 215 in contact with the first P-doped zone 210,
  a first gate electrode 105 in contact with the first gate 101,
  a second gate electrode 205 in contact with the second gate 201,
  a rear gate electrode 405 in contact with the rear gate 400, each of these electrodes being configured to be able to receive the application of the voltage. These electrodes are typically deposited metal layers in contact with each of the doped zones 110, 210 and gates 101, 201, 400.

More specifically, it is provided, in particular, that the following can be applied:
- a first control voltage $V_{110}$ on the first electrode 115,
- a second control voltage $V_{210}$ on the second electrode 215,
- a first gate voltage $V_{G1}$ on the first electrode 105,
- a second gate voltage $V_{G2}$ on the second electrode 205,
- a rear gate voltage $V_{BG}$ on the rear gate electrode 405.

Preferably, all the electrodes 115, 215, 105, 205 and 405 are accessible—i.e. that voltages can be applied to them—from one same face, called front face of the device 1. With this in mind, the rear gate 400 advantageously projects with respect to the dielectric layer 300 so as to enable a tapping of said rear gate 400 from the front face of the device 1. The dielectric layer 300 can further, at this tapping, have an excess thickness. This excess thickness typically corresponds to the sum of the thickness $e_{300}$ of the dielectric layer 300 and of the thickness $e_{10}$ of the active layer 10. The rear gate electrode 405 is thus located at the level in the direction z with the first electrode 115 and the second electrode 215. This makes it possible to facilitate their simultaneous manufacture. Advantageously, thus the presence of at least one shallow trench isolation is provided (commonly called STI) making it possible to electrically isolate the rear gate 400 from the active layer 10.

Thus, the behaviour of the device 1 can be controlled at five control points. FDSOI transistors, commonly used in the microelectronics industry, which have one single gate on the front face, can only be controlled at four control points (drain, source, front gate, rear gate, which can be seen in FIG. 1). Thanks to this additional control point, it is possible to control, more finely, the electrical behaviour of the device 1 with respect to a conventional FDSOI transistor. This also gives the device 1 additional functionalities and makes it possible to use it for other applications, as will be detailed further.

The first control voltage $V_{110}$ and the second control voltage $V_{210}$ constitute, for the device 1, respectively a drain voltage $V_D$ and a source voltage $V_S$, or conversely. More specifically:
- If the first N-doped zone 110 constitutes the first source and the first P-doped zone 210, the second drain, thus the first control voltage $V_{110}$ constitutes the source voltage $V_S$ of the device 1 and the second control voltage $V_{210}$ constitutes the drain voltage $V_D$ of the device 1. This scenario is considered in FIG. 2A.
- If the first N-doped zone 110 constitutes the first drain and the first P-doped zone 210, the second source, thus the first control voltage $V_{110}$ constitutes the drain voltage $V_D$ of the device 1 and the second control voltage $V_{210}$ constitutes the source voltage $V_S$ of the device 1. This scenario is considered in FIG. 2B.

In the first scenario, the source of the device 1 is located at an N-doped zone and the drain at a P-doped zone. In this configuration, the device 1 in operation will therefore have an overall n-MOS type behaviour. Conversely, in the second scenario, the source of the device 1 is located at a P-doped zone and the drain at an N-doped source. The device 1 in operation will therefore this time have an overall p-MOS type behaviour.

It must be noted that the source or drain function of the zones 110, 120, 210 and 220 depends on the voltages which are applicable to them, and more precisely, on the sign of the voltages $V_{110}$-$V_{120}$ and $V_{210}$-$V_{220}$. Thus, it is possible to make the device 1 pass from an n-MOS behaviour to a p-MOS behaviour, and conversely, by simply changing the sign of these voltage differences. The device 1 thus constitutes a vertical switching device (often called "sharp switch device").

The rear gate voltage itself plays a major control role, in the device 1.

The device 1 in operation can be located in a so-called on configuration or in a so-called blocked configuration.

In the blocked configuration, the PN junction 1000 is in a blocked state. It has a space charge zone, or depletion zone, comprising fixed charges, but wherein the free charges cannot circulate. A potential barrier thus separates the n-MOS transistor 100 and the p-MOS transistor 200 and prevents the circulation of the current between the source and the drain of the device 1. This blocked configuration of the device 1 can also be called "OFF state" of the device 1.

In the on configuration of the device 1, the PN junction 1000 is in an on state. There is therefore no potential barrier between the n-MOS transistor 100 and the p-MOS transistor 200. Consequently, the assembly formed by the first conduction channel 103, the PN junction 1000 and the second conduction channel 203 is passed through by charges freely circulating between the source and the drain of the device. The current can therefore circulate in the device 1. This on configuration of the device 1 be called "ON state" of the device 1.

The passage from the blocked configuration to the on configuration of the device 1, or conversely, is done by the switching of the PN junction 1000. Such a junction is characterised, in particular, by its switching speed, which it gives the device 1, itself an excellent passage efficiency from the ON state to the OFF state, and conversely. It is what happens below, being characterised in reference to FIGS. 3A to 8C.

The fact that a low voltage variation makes it possible to make the device pass from one state to another makes it possible to guarantee a high energy efficiency. The device 1 can therefore be used in very low energy consumption electronic applications. This makes it possible, in addition, to improve its performance in terms of speed of responding to an external request. This feature thus at the origin of several significant advantages of the device 1.

All the simulations presented in FIGS. 3A to 8C now going to be described have been performed for a device 1, wherein the first N-doped zone 110 constitutes the source of the n-MOS transistor 100 and the first P-doped zone 210 constitutes the drain of the p-MOS transistor 200 (n-FET type behaviour). The drain-source voltage $V_{DS}=V_D-V_S$ of the device 1 is therefore defined by $V_{210}$-$V_{110}$. It must be noted that simulations based on a device 1 having a p-FET behaviour would make it possible to draw on similar teachings about its efficiency.

Figure 3A:
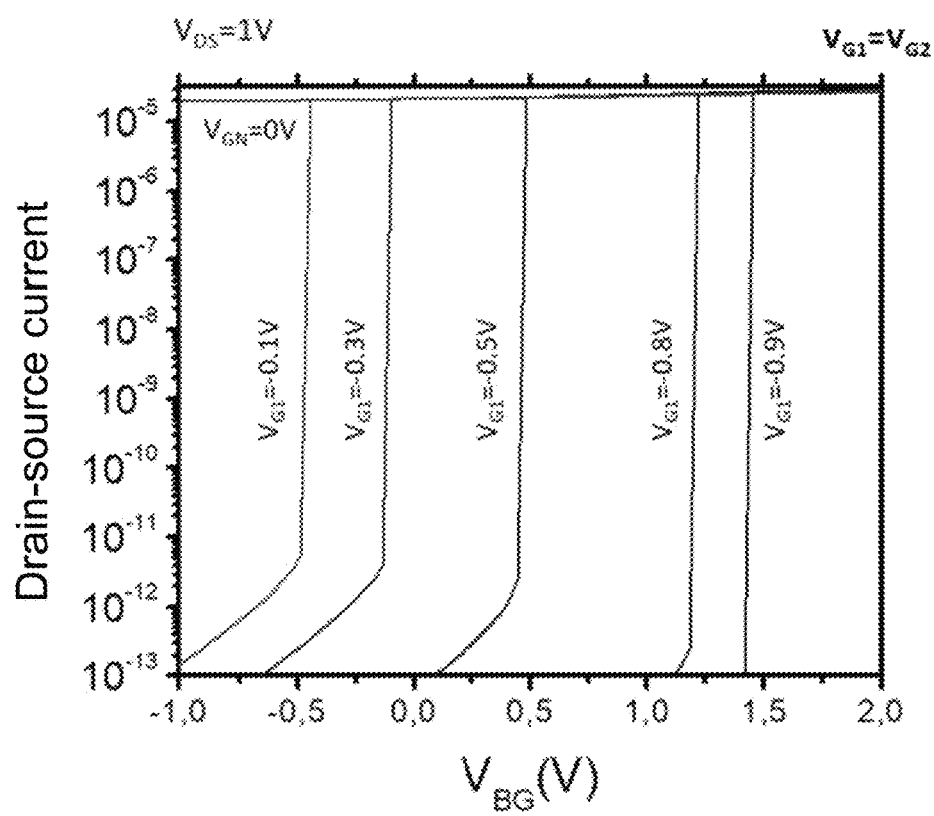
FIGS. 3A and 3B represent current-voltage features of the device according to one of the embodiments of the invention obtained by simulation.
Figures 3B, 3C:
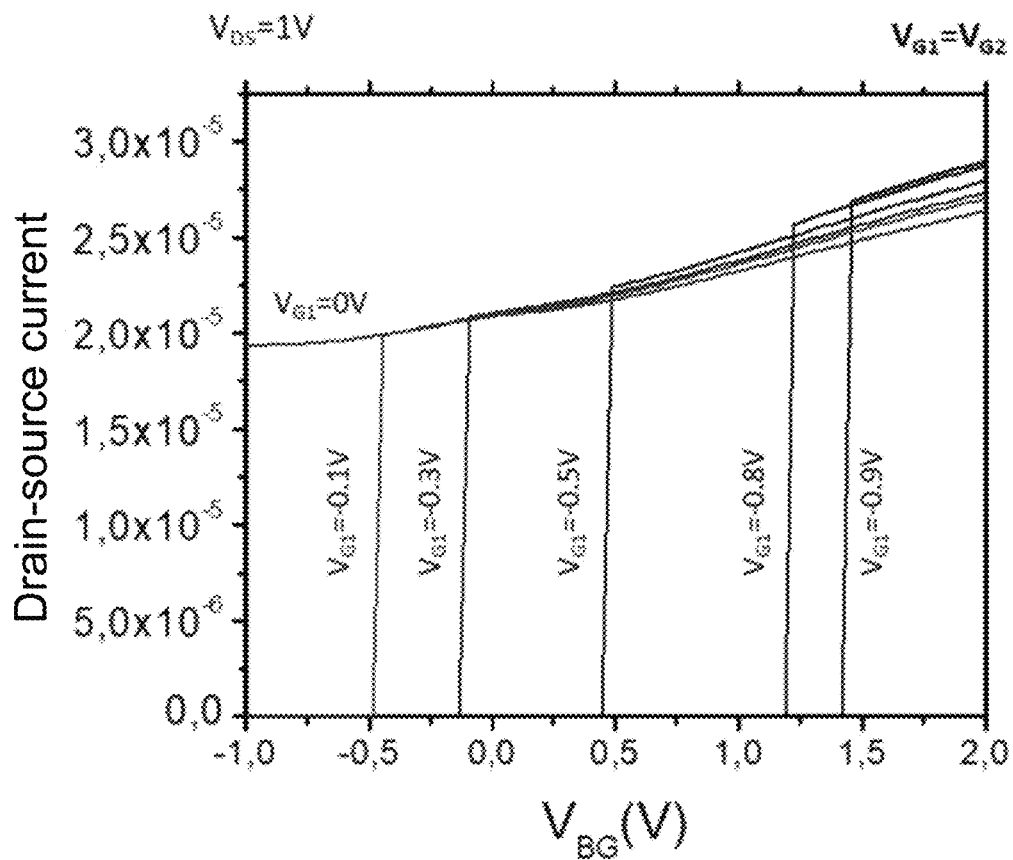
FIG. 3C is a table summarising the parameters applied during the simulations of FIGS. 3A and 3B.

FIGS. 3A and 3B show the current-voltage features $I_D$=f($V_{BG}$), respectively in logarithmic and linear scales, obtained by TCAD (Technology Computer-Aided Design) simulation of the device 1. During this simulation:
- the first gate voltage $V_{G1}$ and the second gate voltage $V_{G2}$ have been set at one same positive value. The simulation has been performed for several values of $V_{G1}=V_{G2}$, varying from −1V to 0V. These different simulations correspond to the different curves in FIGS. 3A and 3B.
- the drain-source voltage $V_{DS}$ has been set at a value of 1V. This value is, in particular, greater than the built-in voltage, or diffusion voltage, of the PN junction 1000.
- the rear gate voltage $V_{BG}$ varies from −1V to 2V.

the evolution of the drain-source current $I_{DS}$ circulating in the device 1 according to $V_{BG}$ is noted.

These elements are summarised in the table presented in FIG. 3C.

These figures show a sudden switching of the current (behaviour sometimes called "steep slope". A variation of the rear gate voltage $V_{BG}$ of a few mV (1 mV=$10^{-3}$V) only enables a variation of up to eight decades of current. This corresponds to a slope under the threshold being able to have values as low as 1 mV/dec. As a comparison, the slope under the threshold of FDSOI transistors commonly used in the industry is generally around 80 mV/dec. The device 1 according to the invention therefore makes it possible to reach performance a lot greater than conventional FDSOI transistors.

For example, for $V_{G1}=V_{G2}=-0.9V$, a variation of a current from about $10^{-5}$A to a current of about $10^{-13}$A is obtained for a variation of $V_{BG}$ of less than 50 mV.

It must be noted that the rear gate voltage at which the device 1 switches $V_{BG,switching}$ can be adjusted over a wide voltage range, in this case, of about −0.5V to close to 1.5V, by adjusting the voltage applied on the first gate 101 and the second gate 201. Thus, the device 1 can be used for different application by simple configuration of the voltages $V_{G1}$ and $V_{G2}$.

Figure 4A:
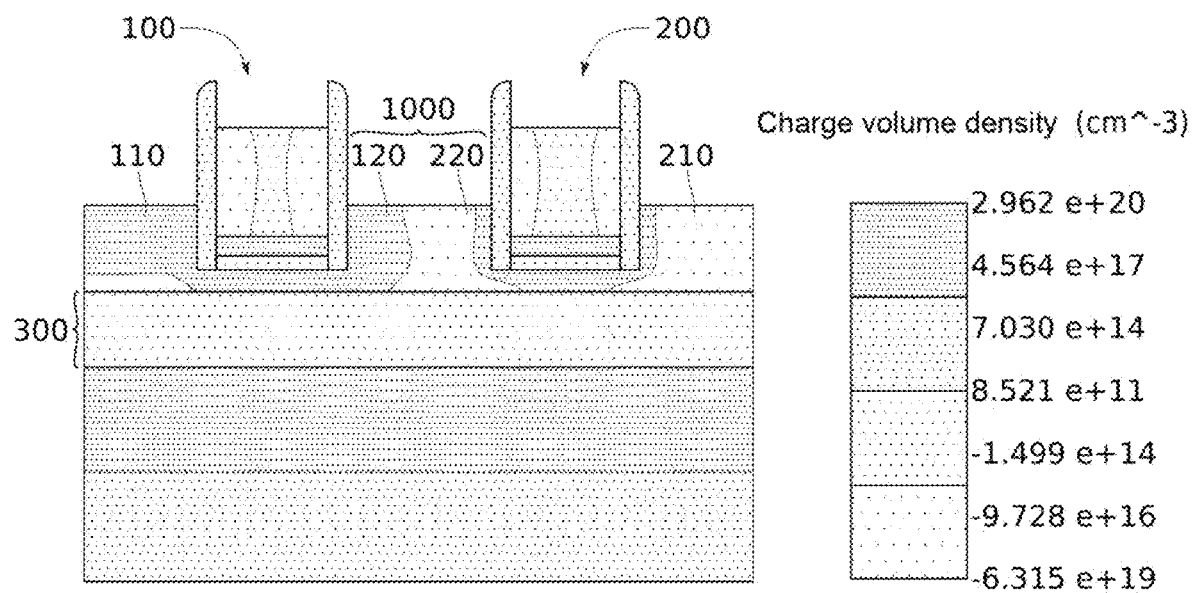
FIGS. 4A and 4B represent the distribution of charges within the device respectively in a blocked configuration ($V_{BG}=1.7V$) and in an on configuration ($V_{BG}=1.8V$).
Figure 4B:
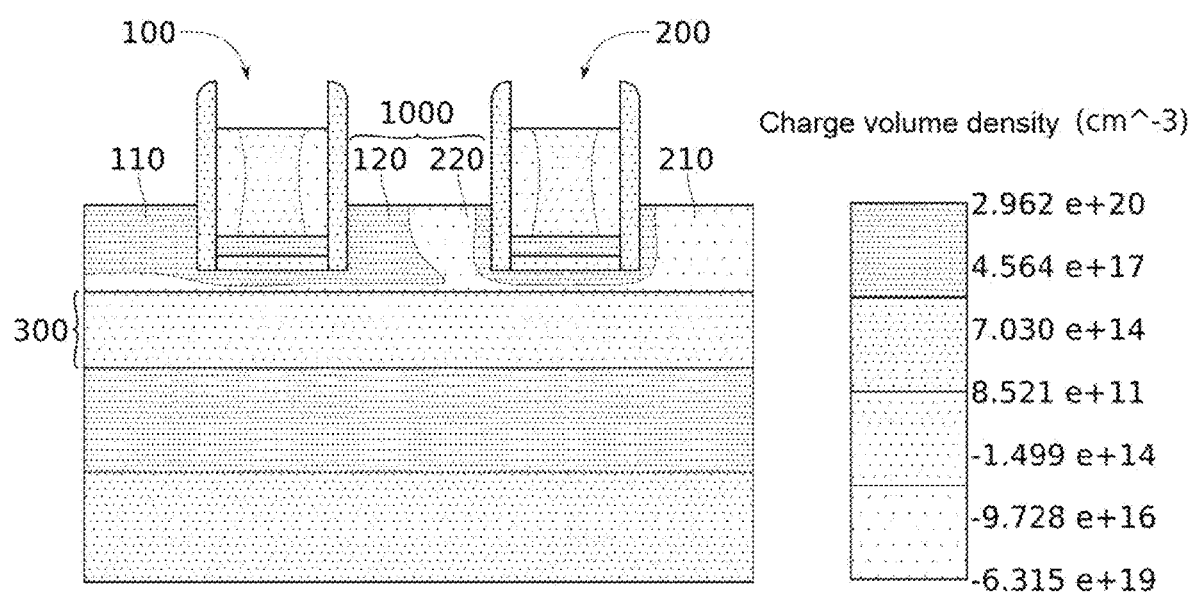

FIGS. 4A and 4B are mappings representing the distribution of the charges within the device 1 in blocked (FIG. 4A) and on (FIG. 4B) configurations.

During this simulation:
the first gate voltage $V_{G1}$ and the second gate voltage $V_{G2}$ have been set at one same value of −1V.
the drain-source voltage $V_{DS}$ has been set at a value of 1V.
the rear gate voltage $V_{BG}$ is set a first time at 1.7V (FIG. 4A) and once at 1.8V (FIG. 4B).
the volume charge density is noted, expressed in C·m$^{-3}$, at any point of the device.

Figures 4C, 5A:
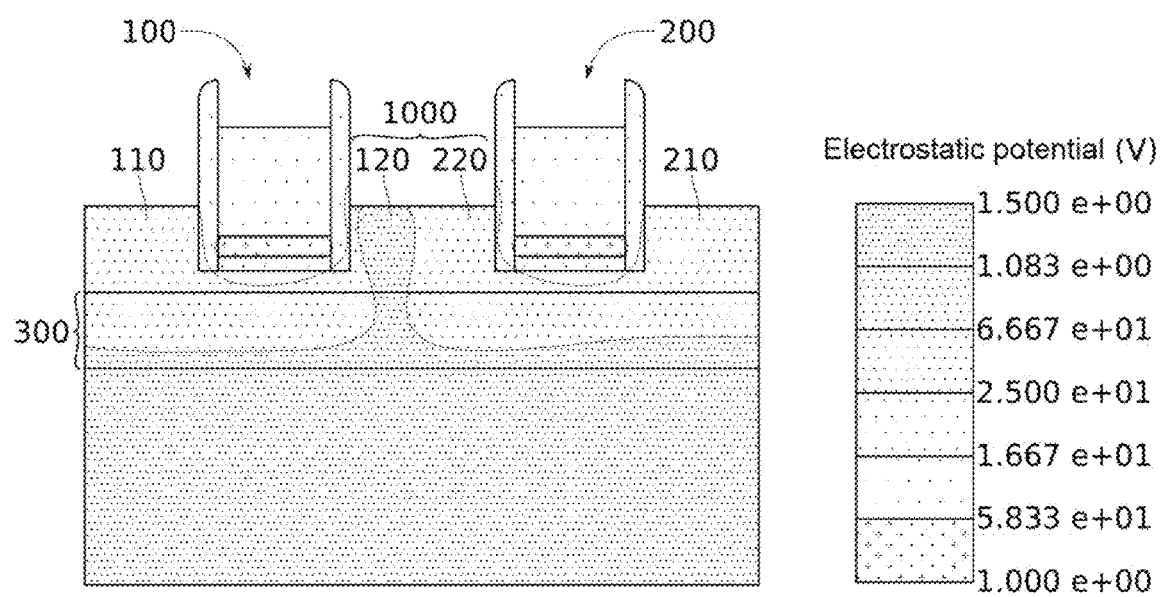
FIG. 4C is a table summarising the parameters applied during the simulations of FIGS. 4A and 4B.
FIGS. 5A and 5B represent the distribution of the electrostatic potential within the device in blocked ($V_{BG}=1.7V$) and on ($V_{BG}=1.8V$) configurations.

These elements are summarised in the table presented in FIG. 4C.

These mappings make it possible, in particular, to observe the evolution of the space charge zone of the PN junction 1000. It is observed that this creates a potential barrier over the whole height of the junction when $V_{BG}$=1.7V (FIG. 4A), which transfers, when the rear gate voltage reaches a value of 1.8V (FIG. 4B). Indeed, it is observed in FIG. 4B, against the upper face 301 of the dielectric layer 300, a continuous zone having a charge density of around $10^{19}$C/m$^3$. It is, in particular, through this zone that the drain-source current $I_{DS}$ circulates once the device is switched. These two figures thus illustrate the switching of the PN junction 1000 and consequently, that of the device 1.

Figures 5B, 5C:
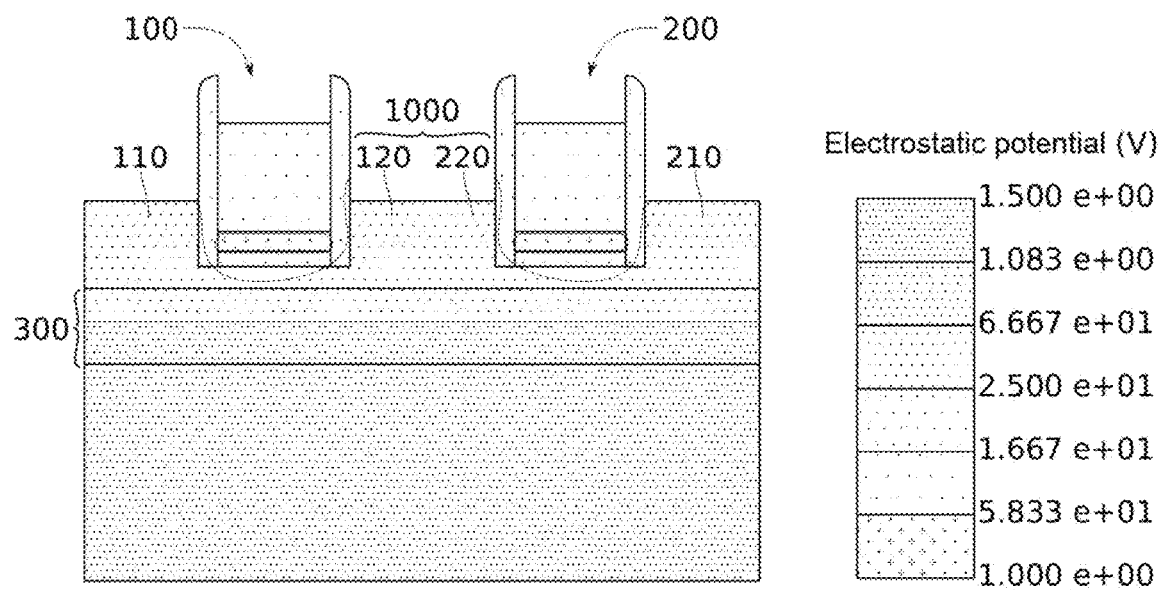
FIG. 5C is a table summarising the parameters applied during the simulations of FIGS. 5A and 5B.

FIGS. 5A and 5B show mappings representing the distribution of the electrostatic potential within the device 1 in blocked (FIG. 5A) and on (FIG. 5B) configurations. The simulation parameters are identical to those of the simulations illustrated in FIGS. 4A and 4B, as indicated in FIG. 5C. A very high difference of electrostatic potential between the second N-doped zone 120 and the second P-doped zone 220 forming the PN junction 1000 is observed in FIG. 5A, showing the potential barrier in the PN junction 1000. After switching and passage to the on configuration, this potential difference disappears, which enables the current to circulate between the source and the drain of the device.

It must be noted that FIGS. 5A and 5B show the fact that a switching can be obtained by making $V_{BG}$ G vary by 100 mV, but it has been shown that a variation of less than 10 mV can suffice to observe the same phenomenon.

Figure 6A:
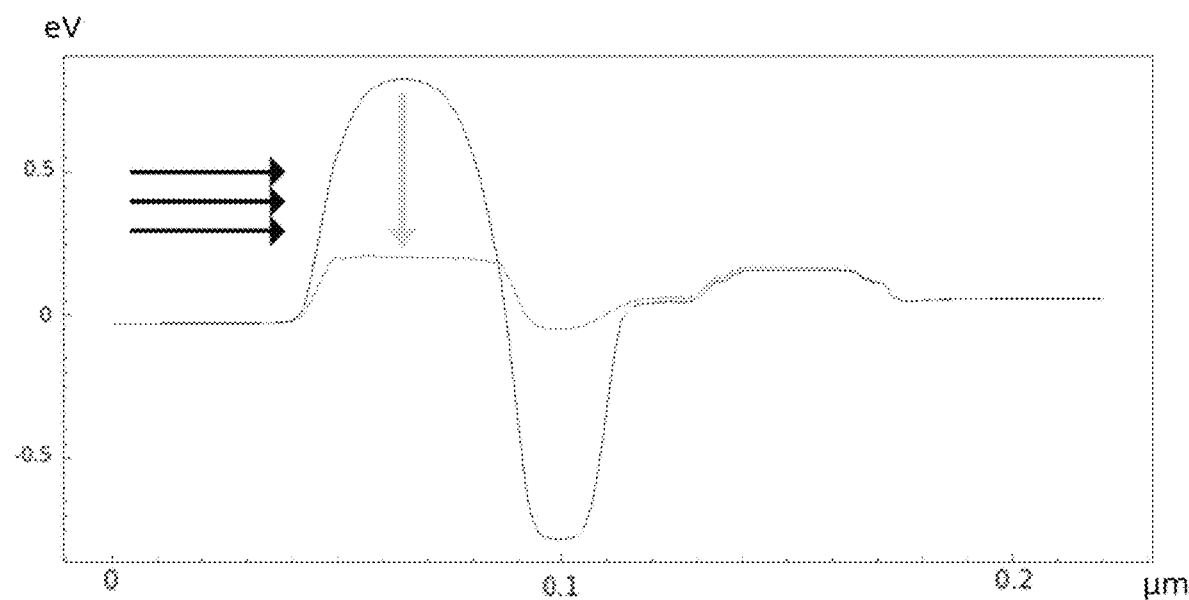
FIGS. 6A and 6B represent the simulations of the level of conduction and valence bands of the device in blocked ($V_{BG}=1.7V$) and on ($V_{BG}=1.8V$) configurations.
Figure 6B:
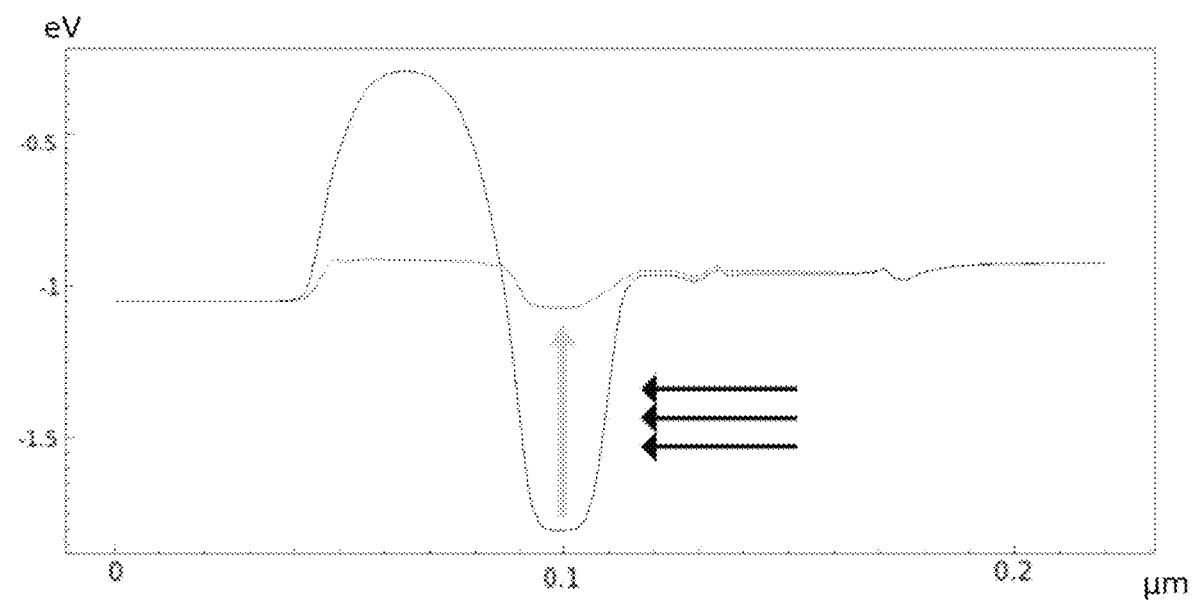
Figures 6C, 7A:
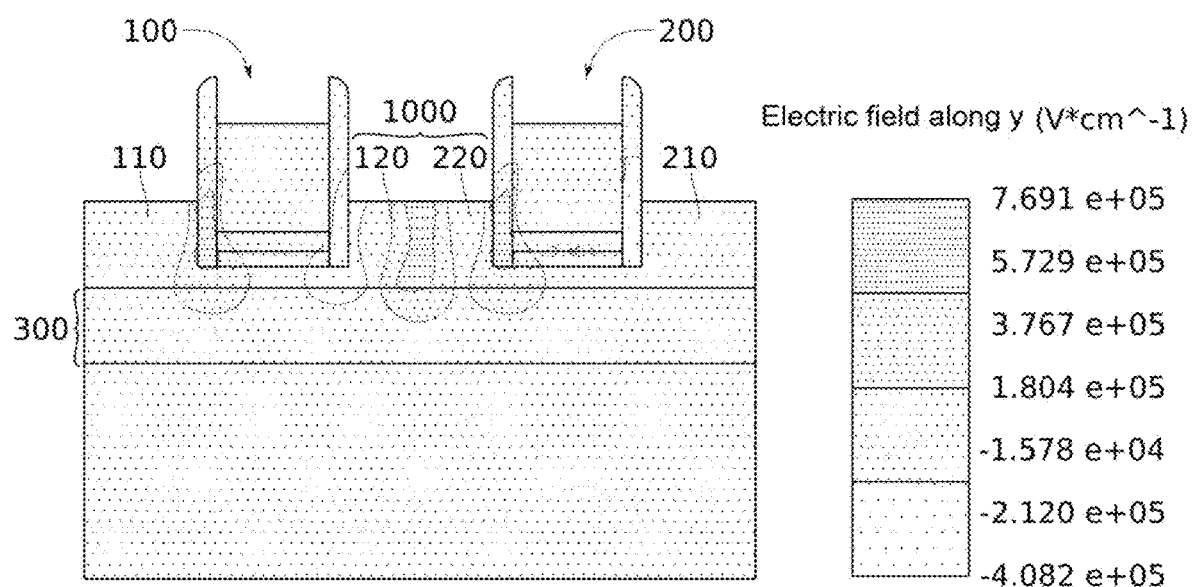
FIG. 6C is a table summarising the parameters applied during the simulations of FIGS. 6A and 6B.
FIGS. 7A and 7B represent the distribution of the electric field in the direction of the transport within the device in blocked ($V_{BG}=1.7V$) and on ($V_{BG}=1.8V$) configurations.

FIGS. 6A and 6B represents simulations of the level of the conduction (FIG. 6A) and valence (FIG. 6B) bands between the source and the drain of the device 1 in blocked (dark grey curves) and on (light grey curves) configurations. The simulation parameters are identical to those of the simulations illustrated in FIGS. 4A and 4B, as indicated in FIG. 6C. It is observed that in the blocked configuration, the conduction band has, at the second N-doped zone 120, a potential barrier blocking the passage of the electrons from the source to the drain. For a value of $V_{BG}$ corresponding to the on configuration of the device 1, this barrier is lowered and the current can circulate. A similar phenomenon occurs for the valence band: in blocked configuration, the valence band has, at the second P-doped zone 220, a potential barrier blocking the passage of the holes from the drain to the source of the device 1. After switching from the blocked configuration to the on configuration, the potential barrier is lowered and the current can circulate. These figures again show that a sudden switching of the device 1 is permitted, thanks to the sudden passage of the PN junction 1000 from the blocked state to the on state, or conversely.

Figures 7B, 7C:
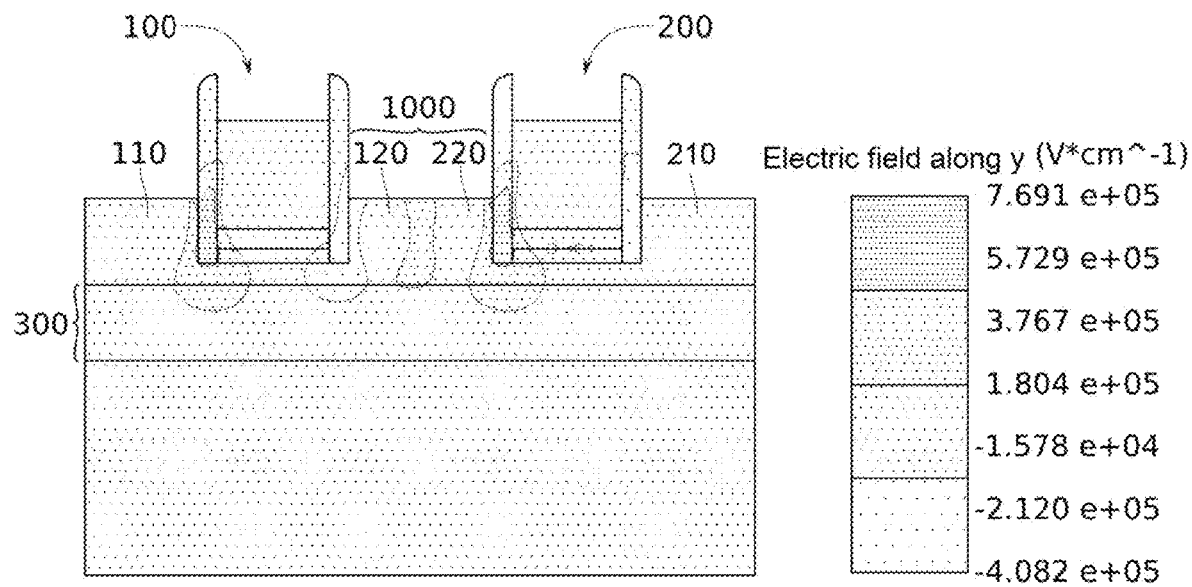
FIG. 7C is a table summarising the parameters applied during the simulations of FIGS. 7A and 7B.

FIGS. 7A and 7B show mappings representing the distribution of the electric field in the direction Y within the device 1 in blocked (FIG. 7A) and on (FIG. 7B) configurations. The simulation parameters are identical to those of the simulations illustrated in FIGS. 4A and 4B, as indicated in FIG. 7C. The switching is conveyed by a strong lateral electric field at the PN junction 1000 in the OFF state and a practically zero electric field in the ON state of the device 1.

Figure 8A:
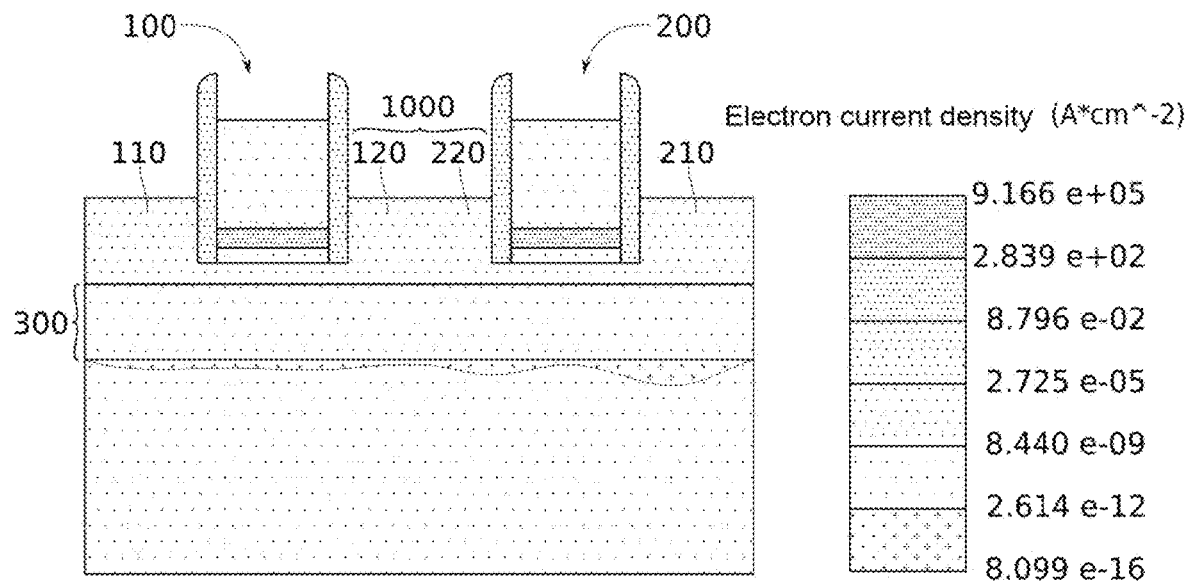
FIGS. 8A and 8B represent the distribution of the electron current density within the device in blocked ($V_{BG}=1.7V$) and on ($V_{BG}=1.8V$) configurations.
Figure 8B:
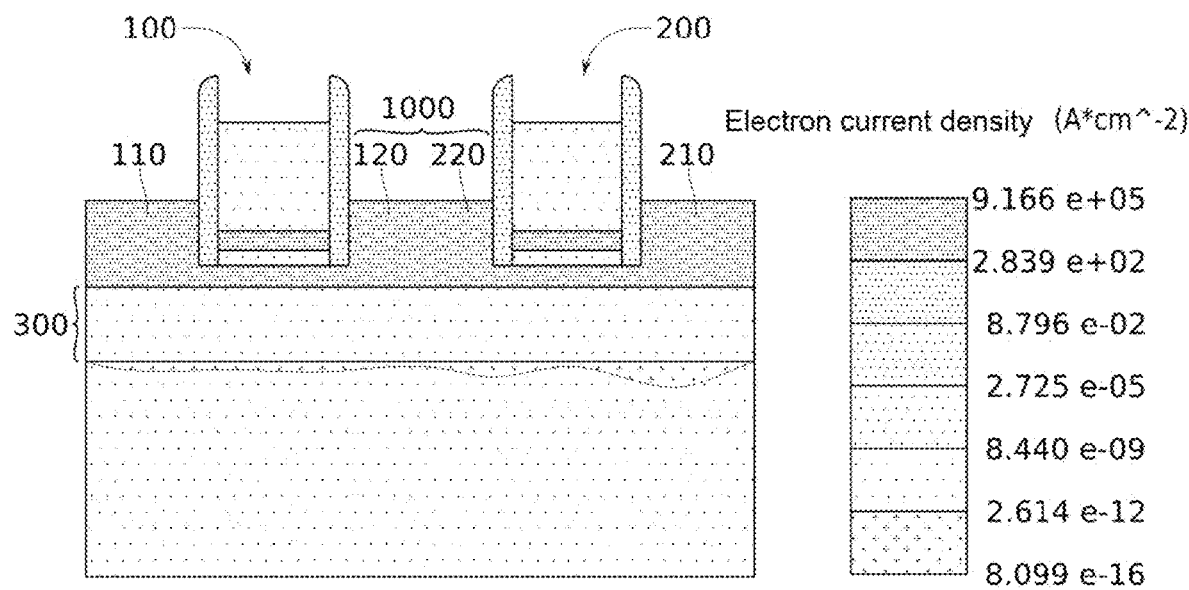

FIGS. 8A and 8B show mappings representing the distribution of the electron current density within the device 1 in blocked (FIG. 8A) and on (FIG. 8B) configurations. A very high increase of the current density occurs after switching of the device 1 from the OFF state to the ON state.

The features which have just been studied in reference to FIGS. 3A to 8C have been obtained by setting the value of the gate voltages $V_{G1}$ and $V_{G2}$ and by making the rear gate voltage $V_{BG}$ vary. They have made it possible to show that a sudden switching could be obtained for the current-voltage feature $I_{DS}=f(V_{BG})$. A sudden switching can however also be obtained for the current-voltage feature $I_{DS}=f(V_{DS})$. It is what is illustrated in FIGS. 9A to 9D.

Figures 8C, 9A:
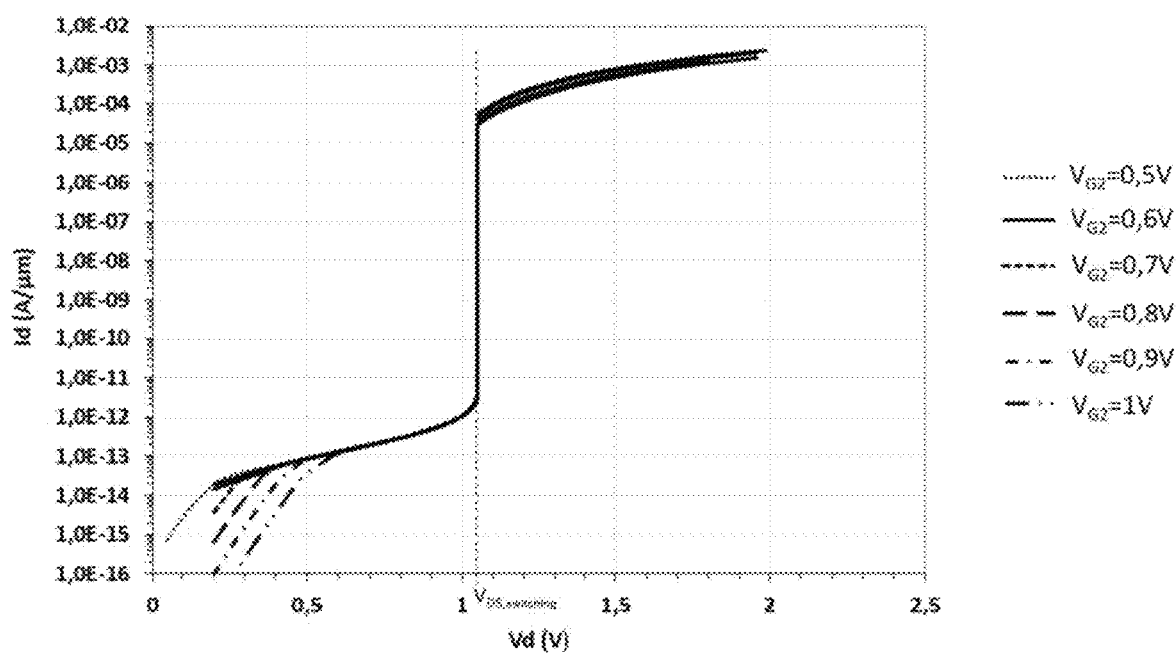
FIG. 8C is a table summarising the parameters applied during the simulations of FIGS. 8A and 8B.
FIGS. 9A, 9C and 9E represent current-voltage features obtained respectively by increasing a second gate voltage $V_{G2}$ and by setting a first gate voltage $V_{G1}$ at a value of −0.5V, by increasing the first gate voltage $V_{G1}$ and by setting the second gate voltage $V_{G2}$ at a value of −0.5V, and by decreasing the second gate voltage.

First, FIG. 9A shows a study of the current-voltage feature $I_{DS}=f(V_{DS})$ according to the second gate voltage $V_{G2}$.

During this simulation:
the first gate voltage $V_{G1}$ is set at −0.5V.
the drain-source voltage $V_{DS}$ varies from 0V to 2V.
the rear gate voltage $V_{BG}$ has been set at 0.4V.
the evolution of the drain-source current $I_{DS}$ circulating in the device 1 is noted, according to $V_{DS}$ and this for different values of $V_{G2}$ of between −1V and 1V corresponding equally to the curve in FIG. 9A.

It is observed that a sudden switching of the drain-source current $I_{DS}$ is obtained around a switching voltage $V_{DS,switching}$=1.05V, and this, whatever the voltage $V_{G2}$ applied on the gate of the p-MOS transistor.

Figures 9B, 9C, 9D:
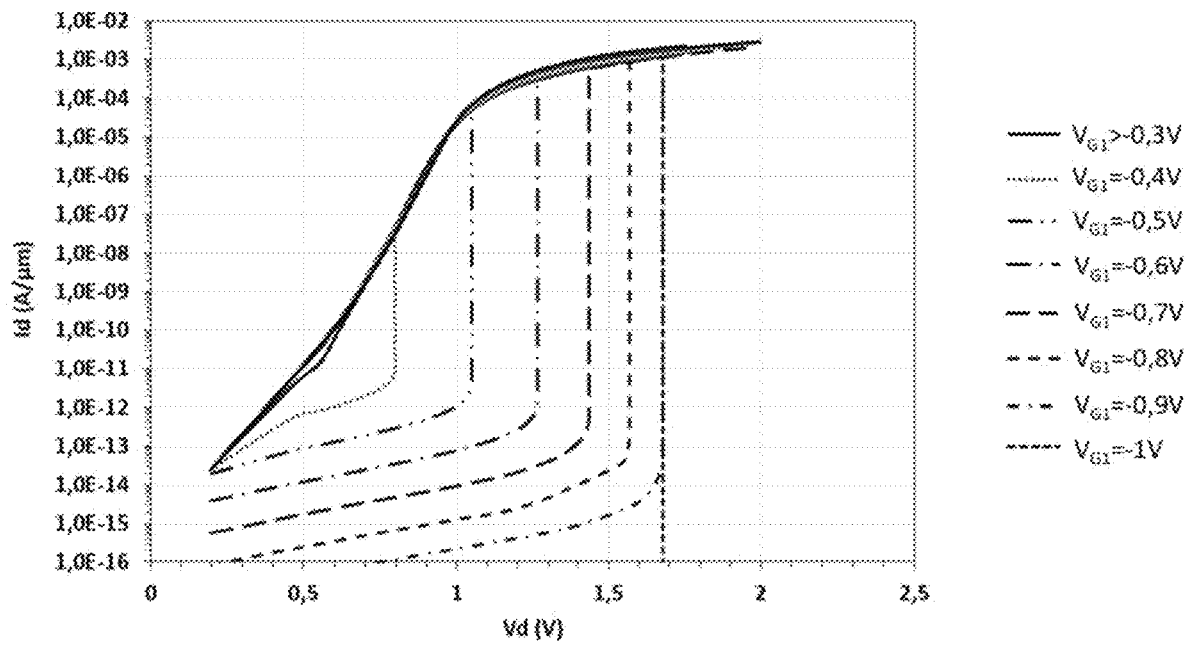
FIGS. 9B and 9D are tables summarising the parameters applied during the simulations of FIGS. 9A, 9C and 9E.

FIG. 9C then shows a study of the current-voltage feature $I_{DS}=f(V_{DS})$ according to the first gate voltage $V_{G1}$. During this simulation:
the second gate voltage $V_{G2}$ is set at −0.5V.
the drain-source voltage $V_{DS}$ varies from 0V to 2V.
the rear gate voltage $V_{BG}$ has been set at 0.4V.
the evolution of the drain-source current $I_{DS}$ circulating in the device 1 is noted, according to $V_{DS}$ and this, for different values of $V_{G1}$ of between −1V and 1V corresponding equally to the curve in FIG. 9C.

It is observed that a sudden switching of the drain-source current $I_{DS}$ is obtained on the condition that the first gate voltage $V_{G1}$ is in the correct range of values. In the present case, it is necessary that $V_{G1}<-0.3V$. Above this threshold, i.e. for $V_{G1}>-0.3V$, the first gate voltage is not sufficient to form the potential barrier at the PN junction 1000 between the drain of the n-MOS transistor 100 and the source of the p-MOS transistor 200. The device 1 thus has no sudden switching and a behaviour similar to that of a PIN diode. For $V_{G1}<-0.3V$, the first gate voltage is sufficient to form the potential barrier at the PN junction 1000. A sudden switching is observed and occurs for a drain-source voltage $V_{DS}$ greater than the first gate voltage $V_{G1}$ is low. Indeed, the lower $V_{G1}$ is, the greater the potential barrier is, the greater the drain-source voltage necessary to make it disappear is, and therefore the greater the switching voltage $V_{DS,switching}$ is.

Figure 9E:
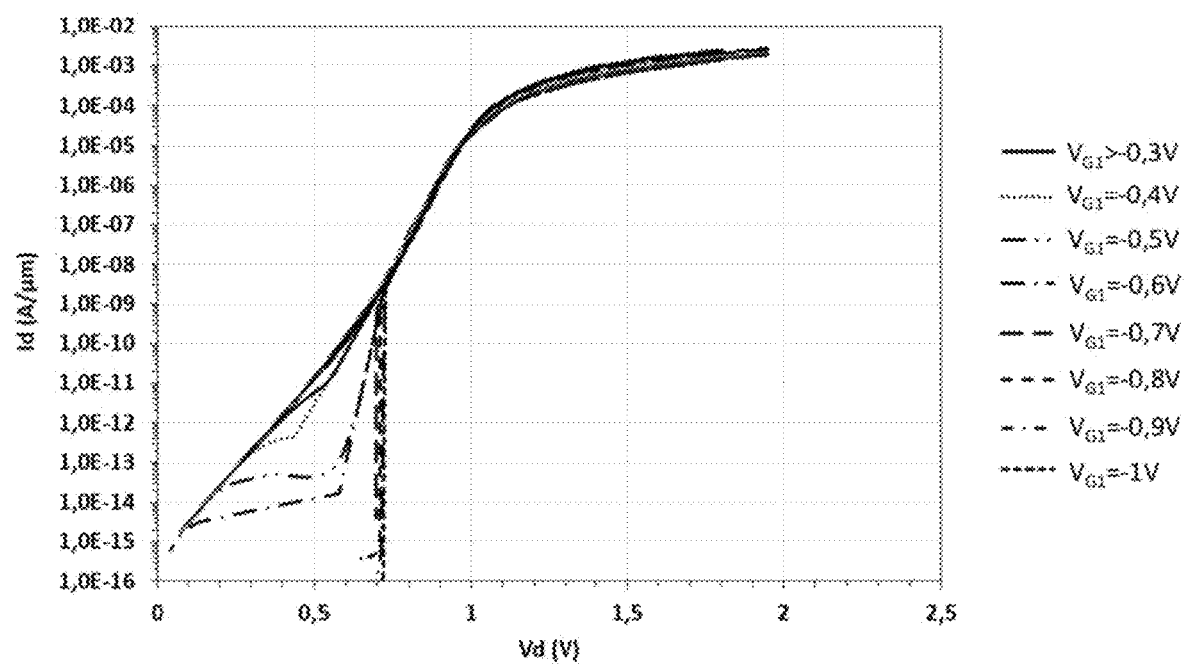

FIG. 9E illustrates the current-voltage feature $I_{DS}=f(V_{DS})$ obtained by a simulation similar to that having made it possible to obtain FIG. 9C, but during which the drain-source voltage $V_{DS}$ varies from 2V to 0V and not from 0V to 2V. This is therefore a feature commonly called "backward" or "reverse", while the feature represented in FIG. 9C constitutes its "forward" counterpart.

It is noted that, for each of the values of first gate voltage $V_{G1}$ studied, the switching voltage $V_{DS,switching}$ is different "backward" mode and in "forward" mode. The switching voltage $V_{DS,switching,BW}$ in backward mode is, in particular, in this case less than the switching voltage $V_{DS,switching,FW}$ in forward mode. These two figures therefore highlight a phenomenon of hysteresis, which can be brought to bear in memory applications.

According to an embodiment, the device 1 comprises a control circuit making it possible to apply the voltages mentioned above on each of these electrodes. The control circuit further makes it possible to make the voltages $V_{110}$, $V_{210}$, $V_{G1}$, $V_{G2}$ and $V_{BG}$ vary, for example in a given range, such that [-5V, 5V].

The control circuit is advantageously configured to be able to make the device 1 pass from the on configuration to the blocked configuration and conversely.

The invention is not limited to the embodiments described above and extends to all the embodiments covered by the invention.

The invention claimed is:

1. A microelectronic device comprising:
    a field-effect n-MOS transistor comprising a first drain, a first source, a first gate and a first gate oxide,
    a first N-doped zone, constituting one from among the first drain and the first source,
    a second N-doped zone, constituting the other from among the first drain and the first source,
    a field-effect p-MOS transistor comprising a second drain, a second source, a second gate and a second gate oxide,
    a first P-doped zone, constituting the second source, if the first N-doped zone constitutes the first drain, or the second drain, if the first N-doped zone constitutes the first source,
    second P-doped zone, constituting the other from among the second drain and the second source,
    a dielectric layer having an upper face in contact with the first N-doped zone, with the second N-doped zone, with the first P-doped zone and with the second P-doped zone, and
    a rear gate in contact with a lower face of the dielectric layer,
    wherein the second N-doped zone and the second P-doped zone form a PN junction.

2. The device according to claim 1 comprising a first electrode and a second electrode, and wherein the first N-doped zone is in contact with the first electrode which is configured to receive a first control voltage and the first P-doped zone is in contact with the second electrode which is configured to receive a second control voltage.

3. The device according to claim 2, wherein:
    the first control voltage constitutes a source voltage of the device and the second control voltage constitutes a drain voltage of the device, or
    the second control voltage constitutes the source voltage of the device and the first control voltage constitutes the drain voltage of the device.

4. The device according to claim 2, further comprising:
    a first gate electrode and a second gate electrode, and wherein the first gate is in contact with the first gate electrode which is configured to receive a first gate voltage and the second gate is in contact with the second gate electrode which is configured to receive a second gate voltage,
    a rear gate electrode, wherein the rear gate is in contact with the rear gate electrode which is configured to receive a rear gate voltage, and
    a control circuit configured to apply:
    the first control voltage on the first electrode,
    the second control voltage on the second electrode,
    the first gate voltage $V_{G1}$ on the first gate electrode,
    the second gate voltage $V_{G2}$ on the second electrode, and
    the rear gate voltage on the rear gate electrode,
    the first control voltage, the second control voltage, the first gate voltage $V_{G1}$, the second gate voltage $V_{G2}$ and the rear gate voltage being able to take on different values.

5. The device according to claim 4, wherein the control circuit is configured to be able to make the device pass from an on configuration, wherein the PN junction is in an on state, to a blocked configuration, wherein the PN junction in a blocked state, or conversely, by making the rear gate voltage vary between an open rear gate voltage and a blocked rear gate voltage distinct from the open rear gate voltage.

6. The device according to claim 5, wherein $V_{G1}=V_{G2}+\Delta V_G$ with $\Delta V_G$ of between -1V and +1V.

7. The device according to claim 5, wherein $V_{G1}<0$.

8. The device according to claim 5, wherein $V_{G2}<0$.

9. The device according to claim 5, wherein $V_{G1}>0$ and $V_{G2}>0$.

10. The device according to claim 5, wherein $V_{G1}=V_{G2}$.

11. The device according to claim 5, wherein the PN junction has a diffusion voltage, and wherein the drain-source voltage is greater than the diffusion voltage.

12. The device according to claim 5, wherein the rear gate voltage is between -1 and 2V.

13. The device according to claim 4, wherein the first gate voltage $V_{G1}$, the second gate voltage $V_{G2}$ and the rear gate voltage are between -5 and 5V.

14. A method for controlling the device according to claim 2 comprising:
    applying the first control to the first N-doped zone and applying the second control voltage to the first P-doped zone, wherein:
    the first control voltage constitutes a source voltage of the device and the second control voltage constitutes a drain voltage of the device, or the second control voltage constitutes the source voltage of the device and the first control voltage constitutes the drain voltage of the device.

15. The method for controlling the device according to claim 14, wherein the device comprises a rear gate electrode, the rear gate is in contact with the rear gate electrode which is configured to receive of a rear gate voltage, and wherein the rear gate voltage varies between an open rear gate voltage and a blocked rear gate voltage distinct from the open rear gate voltage, so as to make the device pass from an on configuration, wherein the PN junction is in an on state, to a blocked configuration, wherein the PN junction is in a blocked state.

16. The device according to claim 1 comprising a first gate electrode and a second gate electrode, and wherein the first gate is in contact with the first gate electrode which is configured to receive a first gate voltage $V_{G1}$ and the second gate is in contact with the second gate electrode which is configured to receive a second gate voltage $V_{G2}$.

17. The device according to claim 1, comprising a rear gate electrode, wherein the rear gate is in contact with the rear gate electrode which is configured to receive a rear gate voltage.

18. The device according to claim 1, wherein the n-MOS transistor and the p-MOS transistor are separated by a distance greater than 10 nm and less than 500 nm.

19. The device according to claim 1, wherein the n-MOS transistor and the p-MOS transistor are separated by a distance greater than 50 nm and less than 500 nm.

* * * * *